(12) United States Patent
Yates et al.

(10) Patent No.: US 7,285,811 B2
(45) Date of Patent: Oct. 23, 2007

(54) MRAM DEVICE FOR PREVENTING ELECTRICAL SHORTS DURING FABRICATION

(75) Inventors: Donald L. Yates, Boise, ID (US); Garry A. Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/513,244

(22) Filed: Aug. 31, 2006

(65) Prior Publication Data

US 2006/0289913 A1 Dec. 28, 2006

Related U.S. Application Data

(63) Continuation of application No. 10/721,744, filed on Nov. 26, 2003, now Pat. No. 7,119,388, which is a continuation of application No. 10/119,952, filed on Apr. 11, 2002, now Pat. No. 6,673,675.

(51) Int. Cl.
*H01L 29/76* (2006.01)
*H01L 21/00* (2006.01)

(52) U.S. Cl. .................. 257/295; 257/421; 257/422; 257/E27.005; 438/33; 438/257; 438/E21.665

(58) Field of Classification Search .................. 438/3, 438/257–258, 593–594; 257/295, 259–290, 257/314–316, 421–422
See application file for complete search history.

(56) References Cited

U.S. PATENT DOCUMENTS

| | | | |
|---|---|---|---|
| 5,956,267 A | 9/1999 | Hurst et al. | |
| 5,966,603 A * | 10/1999 | Eitan | 438/258 |
| 6,107,656 A * | 8/2000 | Igarashi | 257/295 |
| 6,153,443 A | 11/2000 | Durlam et al. | |
| 6,716,644 B2 | 4/2004 | Nejad et al. | |
| 6,743,641 B2 | 6/2004 | Yates et al. | |
| 6,750,069 B2 | 6/2004 | Durcan et al. | |
| 6,780,652 B2 | 8/2004 | Lee | |
| 7,119,388 B2 * | 10/2006 | Yates et al. | 257/295 |

OTHER PUBLICATIONS

Nanoscale and Novel Engineered Materials, S.J. Pearton, University of Florida, Slide Show of "Plasma Etching of GMR and CMR Materials," Jan. 22, 1998, web address www.phys.ufl.edu/~nanoscale/welcome.html/.

* cited by examiner

*Primary Examiner*—Dung A. Le
(74) *Attorney, Agent, or Firm*—Dickstein Shapiro LLP

(57) ABSTRACT

The present invention provides an MRAM cell which minimizes the occurrence of electrical shorts during fabrication. A first conductor is provided in a trench in an insulating layer and an upper surface of the insulating layer and the first conductor is planarized. A first dielectric layer is deposited over the first conductor and insulating layer to a thickness at least greater than the thickness of a desired MRAM cell. The first dielectric layer is patterned and etched to form an opening over the first conductor for the cell shapes. The magnetic layers comprising the MRAM cell are consecutively formed within the cell shapes and the first dielectric layer.

16 Claims, 15 Drawing Sheets

("PRIOR ART")

MRAM DEVICE FOR PREVENTING
ELECTRICAL SHORTS DURING
FABRICATION

CROSS REFERENCE TO RELATED
APPLICATIONS

The present application is a continuation of U.S. application Ser. No. 10/721,744, now U.S. Pat. No. 7,119,388 filed Nov. 26, 2003, which in turn is a continuation of U.S. application Ser. No. 10/119,952, filed Apr. 11, 2002 (now U.S. Pat. No. 6,673,675, issued Jan. 6, 2004), the disclosures of which are herewith incorporated by reference in their entirety.

FIELD OF INVENTION

The present invention relates to a magnetic random access memory (MRAM) and a fabricating method thereof, and more particularly to a method of forming the MRAM cells.

BACKGROUND OF THE INVENTION

Magnetic random access memories (MRAMs) employ memory cells having magnetic multilayer films as storage elements. When in use, an MRAM cell stores information as digital bits, in the form of relative magnetic orientations of spaced thin magnetic multilayer films forming each memory cell. Each MRAM cell has two stable magnetic film orientations, one which produces a high resistance across the cell representing e.g. a logic state 0 and another which produces a lower resistance across the cell representing e.g. a logic state 1, or vice versa.

A typical multilayer-film MRAM array includes a number of bit or digit (column) lines intersected by a number of word (row) lines. An MRAM cell is formed between a digit and row line at each intersection.

The basic memory MRAM cell has a first pinned ferromagnetic layer and a second free (sense) magnetic layer with a nonmagnetic layer between them. The pinned ferromagnetic layer has a fixed magnetic orientation while the free (sense) layer may have two different magnetic orientations in accordance with the two directions of an applied write magnetic field, depending on the logical data stored in the cell. Each of the ferromagnetic layers is actually formed of a stack of as many as ten different overlapping material layers. Fabrication of such stacks requires deposition of the thin materials layer by layer, according to a predefined order.

FIG. 1 shows an exemplary conventional MRAM structure including MRAM cells 22 formed as layer stacks which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of ferromagnetic materials, is provided over each digit line 18. A nonmagnetic layer 25 of, for example, $Al_2O_3$ is formed over the pinned layer 20. A free (sense) layer 21 is provided over the nonmagnetic layer. The MRAM cells 22 are coupled to a word line 23 that intersects three pinned layers 20 and associated cells 22. The word line 23 and bit line 18 may also be interchanged.

FIG. 2 illustrates a side sectional view of the MRAM cells 22 of FIG. 1. As shown, pinned layer 20 and sense layer 21 are comprised of several individual layers, including a bottom conductive barrier layer 24 formed of, for example, Ta, at the base of the pinned layer 20. The barrier layer 24 also lines the trenches in which the bit lines 18 are formed. Also, pinned layer 20 and sense layer 21 are separated by a magnetically nonconductive tunnel junction layer 25, for example, $Al_2O_3$.

Typically, during an etching step to define the cells 22, utilizing, for example, ion milling, the conductive layer 24 may sputter back onto the sidewall of stacks 22 forming a side conductive layer 26 creating an undesirable electrical short between the pinned 20 and sense 21 layers. Thus, during a read operation, the current may flow through the side conductive layer 26 rather than flow through the tunnel junction layer 25, because of a short produced by layer 26, causing improper resistance sensing. Hence, what is needed is a method of fabricating an MRAM cell which will not create a short as described above.

SUMMARY OF THE INVENTION

The present invention provides a method of forming an MRAM cell which minimizes the occurrence of electrical shorts during fabrication. In an exemplary embodiment of the present invention, a first conductor in a trench is provided in an insulating layer and an upper surface of the insulating layer and the first conductor are planarized. Then, a first dielectric layer is deposited over the first conductor and insulating layer to a thickness at least greater than the thickness of an MRAM cell to be formed. The first dielectric layer is then patterned and etched to form openings for the cells over the first conductor. Then, the magnetic layers comprising the MRAM cell are consecutively formed within the openings and over the first dielectric layer. Then, a second dielectric layer is formed over the magnetic layers. The second dielectric layer and the magnetic layers are then removed down to the top surface plane of the first dielectric layer to form the MRAM cells. Any, unwanted corners of the cell are removed, for example, by oxidation.

The above advantages and features of the invention will be more clearly understood from the following detailed description which is provided in connection with the accompanying drawings.

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

Figure 1:
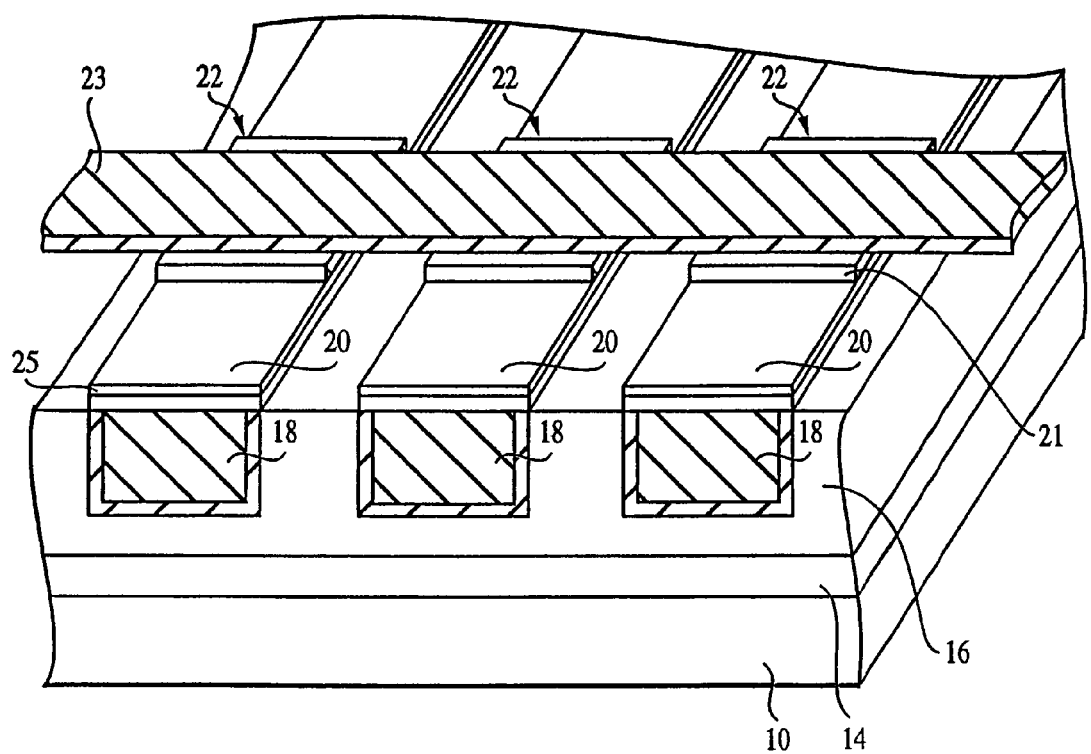
FIG. 1 is a schematic three-dimensional view of a portion of a conventional MRAM structure.
Figure 1A:
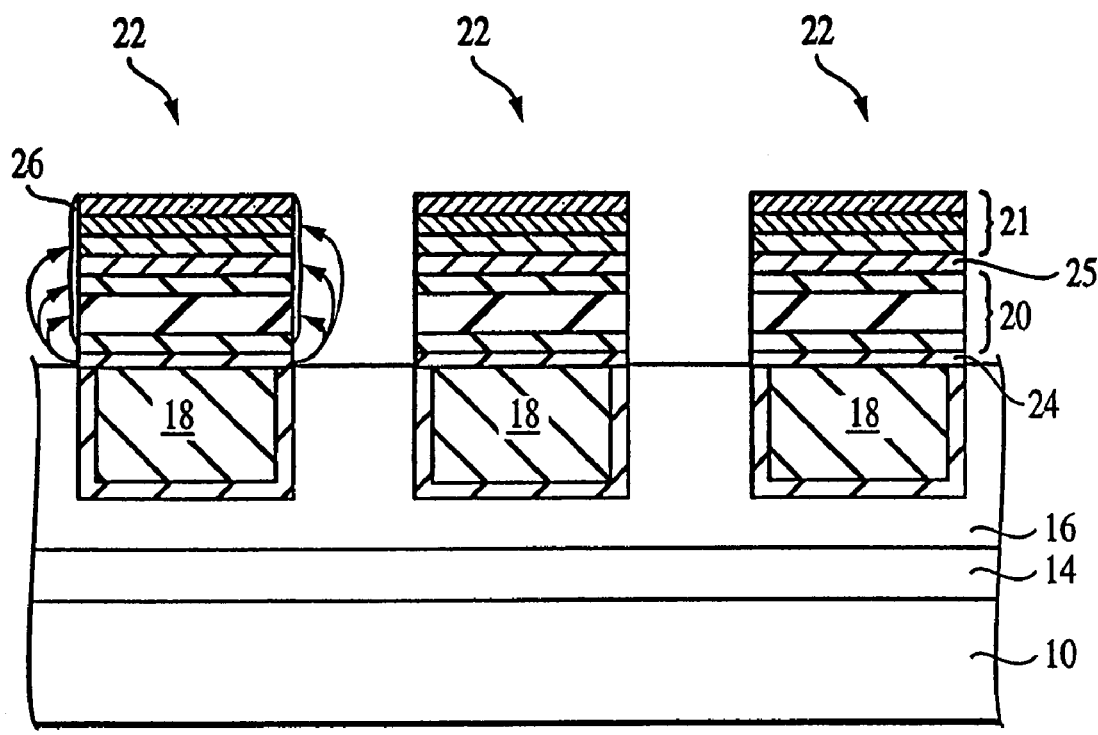
FIG. 1A is a side sectional view of the MRAM structure of FIG. 1 showing a side conductive layer formed thereon.
Figure 2:
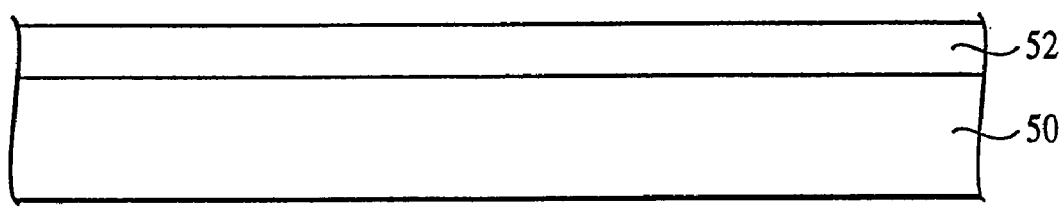
FIG. 2 illustrates a partial cross-sectional view of a semiconductor topography, at an intermediate stage of the processing, wherein a MRAM structure will be constructed in accordance with the present invention.

Referring now to the drawings, where like elements are designated by like reference numerals, FIGS. 2-23 illustrate an exemplary embodiment of a method of forming MRAM structures. FIG. 2 depicts a portion of a semiconductor substrate 50 on which underlying layer 52 has been already formed according to well-known methods of the prior art. The underlying layer 52 could include, for example, circuit layers forming CMOS devices and circuits.

Figure 3:
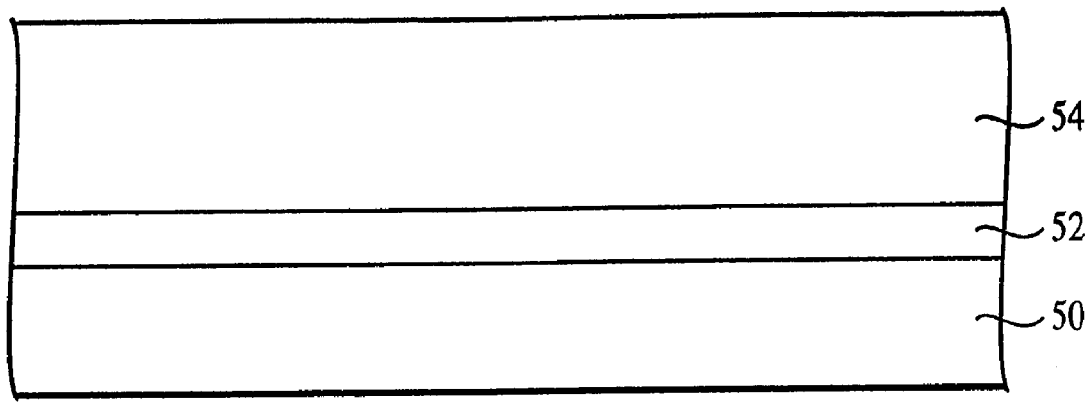
FIG. 3 illustrates a partial cross-sectional view of the MRAM structure at a stage of processing subsequent to that shown in FIG. 2.

Referring now to FIG. 3, an insulating (or dielectric) layer 54 is formed over the substrate 50 and the underlying layer 52. In an exemplary embodiment of the invention, the insulating layer 54 is blanket deposited by spin coating to a thickness of about 1,000 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, BPSG, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 4:
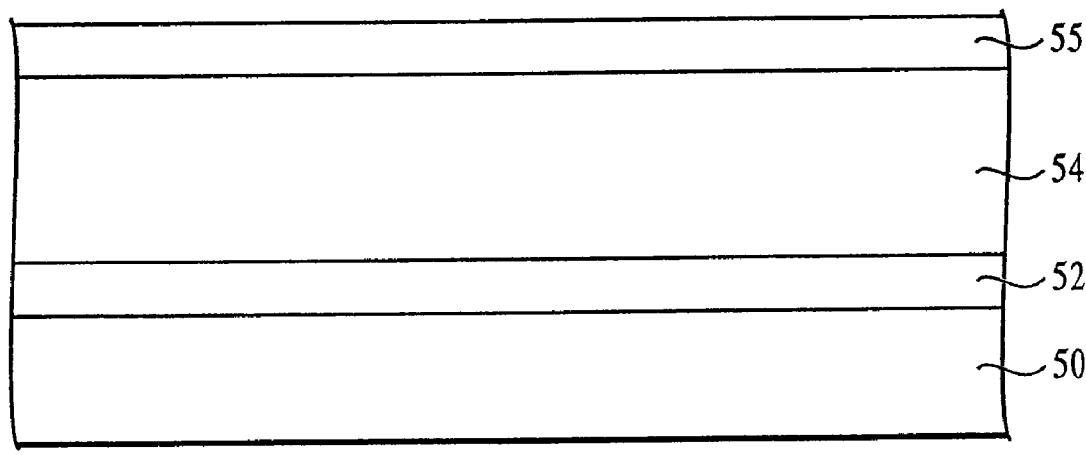
FIG. 4 illustrates a partial cross-sectional view of the MRAM structure at a stage of processing subsequent to that shown in FIG. 3.

Next, as illustrated in FIG. 4, a photoresist layer 55 is formed over the insulating layer 54. The photoresist layer 55 is exposed through a mask 56 (FIG. 5) with high-intensity UV light. The mask 56 may include any suitable pattern of opaque and clear regions that may depend, for example, on the desired pattern to be formed in the insulating layer 54. This way, portions 55a of the photoresist layer 55 are exposed through portions 56a of the mask 56 wherever portions of the insulating layer 54 need to be removed.

Figure 5:
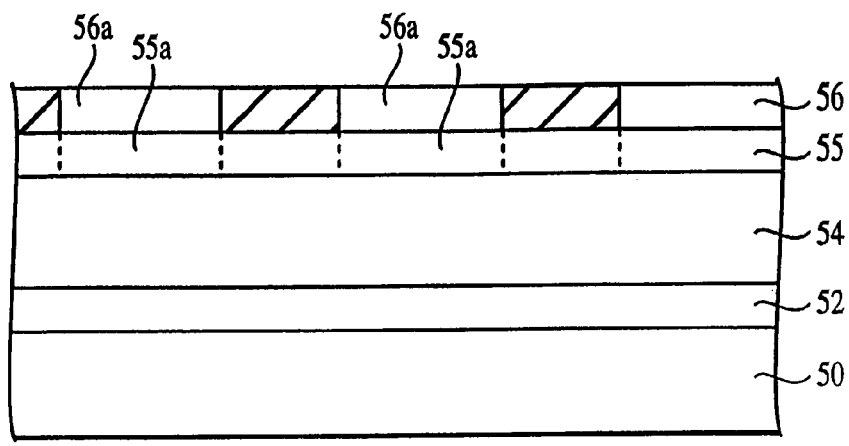
FIG. 5 illustrates a partial cross-sectional view of the MRAM structure at a stage of processing subsequent to that shown in FIG. 4.
Figure 6:
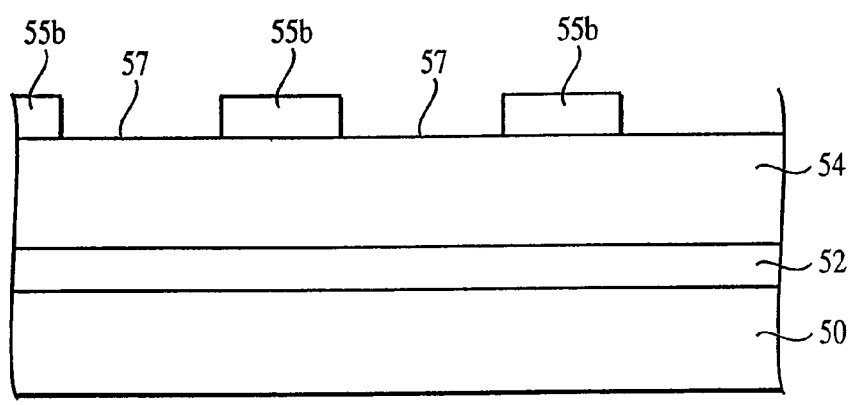
FIG. 6 illustrates a partial cross-sectional view of the MRAM structure at a stage of processing subsequent to that shown in FIG. 5.

Although FIG. 5 schematically illustrates mask 56 positioned over the photoresist layer 55, those skilled in the art will appreciate that mask 56 is typically spaced from the photoresist layer 55 and light passing through mask 56 is focused onto the photoresist layer 55. After exposure and development of the exposed portions 55a, portions 55b of the unexposed and undeveloped photoresist are left over the insulating layer 54, as shown in FIG. 6. This way, openings 57 (FIG. 6) are formed in the photoresist layer 55.

Figure 7:
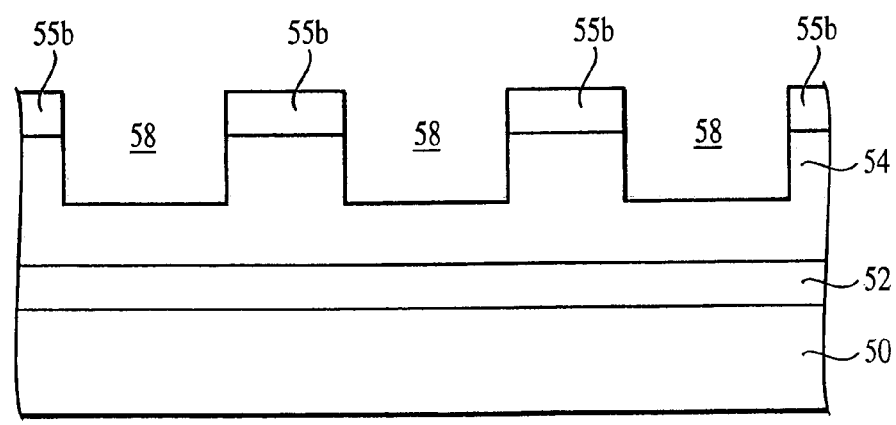
FIG. 7 illustrates a partial cross-sectional view of the MRAM structure at a stage of processing subsequent to that shown in FIG. 6.
Figure 8:
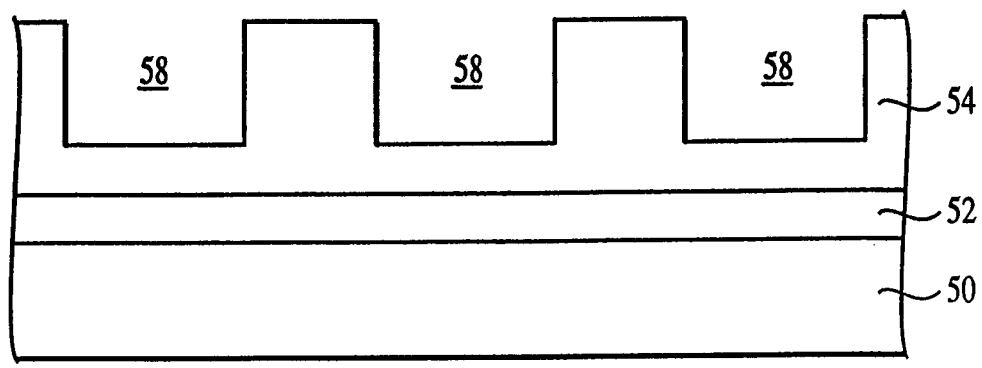
FIG. 8 illustrates a partial cross-sectional view of the MRAM structure at a stage of processing subsequent to that shown in FIG. 7.

An etch step is next performed to obtain trenches 58 in the insulating layer 54, as illustrated in FIGS. 7-8. The trenches 58 are etched to a depth of about 500 Angstroms to about 2,000 Angstroms, more preferably of about 1,000 Angstroms. Subsequent to the formation of the trenches 58, the remaining portions 55b of the positive photoresist layer 55 are then removed by chemicals, such as hot acetone or methylethylketone, or by flooding the substrate 50 with UV irradiation to degrade the remaining portions 55b to obtain the structure of FIG. 8.

Figure 9:
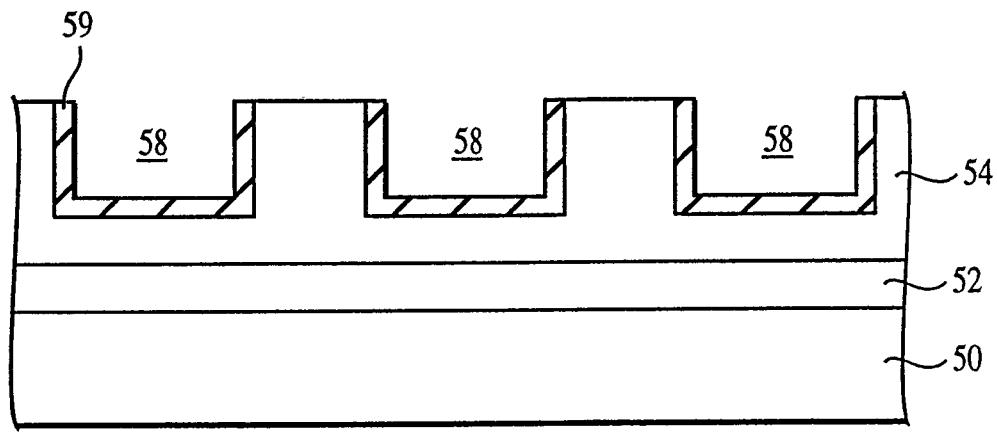
FIG. 9 illustrates a partial cross-sectional view of the MRAM structure at a stage of processing subsequent to that shown in FIG. 8.

Subsequent to the formation of the trenches 58 (FIGS. 7-8), a thin barrier layer 59 is formed in the trenches 58 and over the insulating layer 54, and then chemical mechanical polished to remove barrier layer material from the top portions of the insulating layer 54, as shown in FIG. 9. The barrier layer 59 may comprise bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum which is deposited to a thickness of about 5 nm to about 10 nm. This layer may also be comprised of a ferromagnetic material deposited on the barrier or in place of the barrier for the purpose of field focusing.

Figure 10:
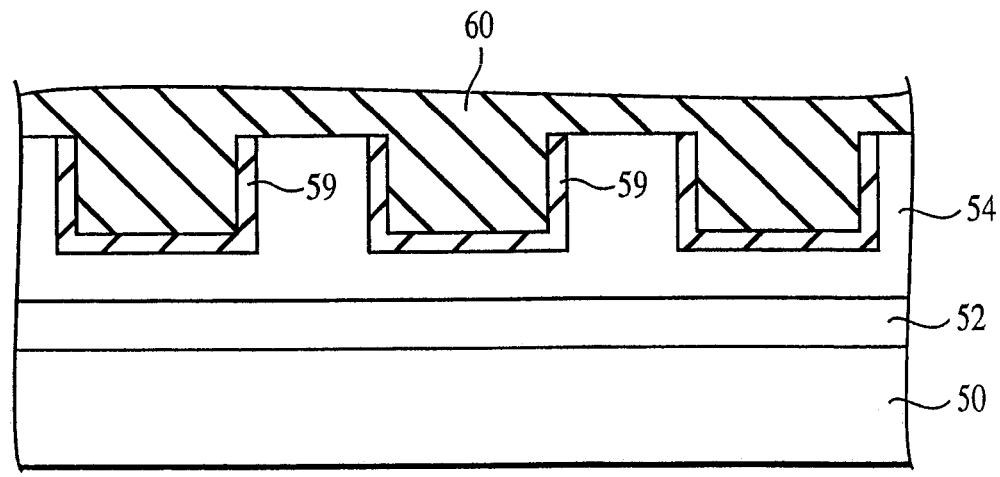
FIG. 10 illustrates a partial cross-sectional view of the MRAM structure at a stage of processing subsequent to that shown in FIG. 9.

Next, as illustrated in FIG. 10, a conductive material layer 60 is formed over the barrier layer 59 and the insulating layer 54 to fill in the trenches 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 11:
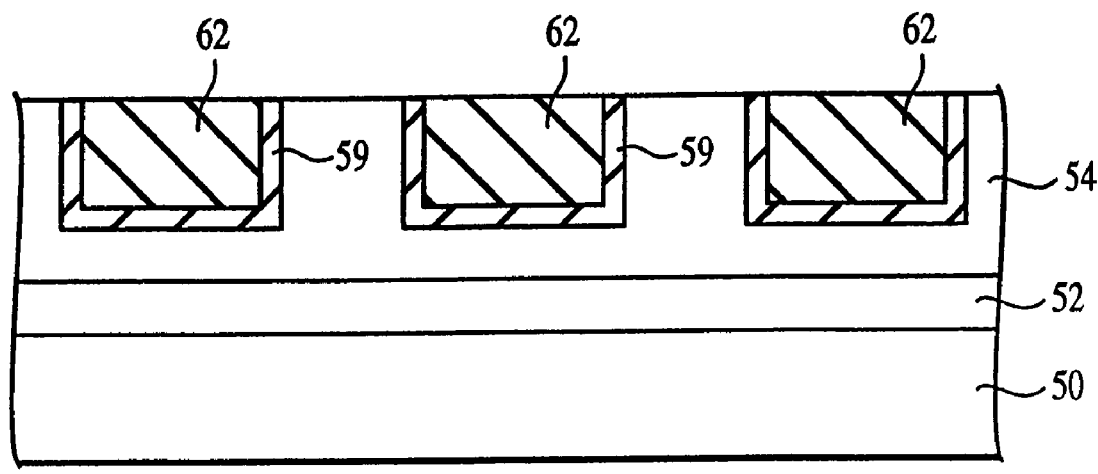
FIG. 11 illustrates a partial cross-sectional view of the MRAM structure at a stage of processing subsequent to that shown in FIG. 10.

The conductive material layer 60 is formed over the barrier layer 59 by deposition, for example, and then excess material is removed to form metal lines 62 (FIG. 11). In an exemplary embodiment of the present invention, the excess conductive material layer 60 is removed by means of chemical mechanical polishing (CMP). The top surfaces of the barrier layer 59 and the metal lines 62 are generally flat and uniform across the entire surface of the substrate, as shown in FIG. 11. Each metal line 62 will form the bit or digit line of an MRAM structure.

Figure 12:
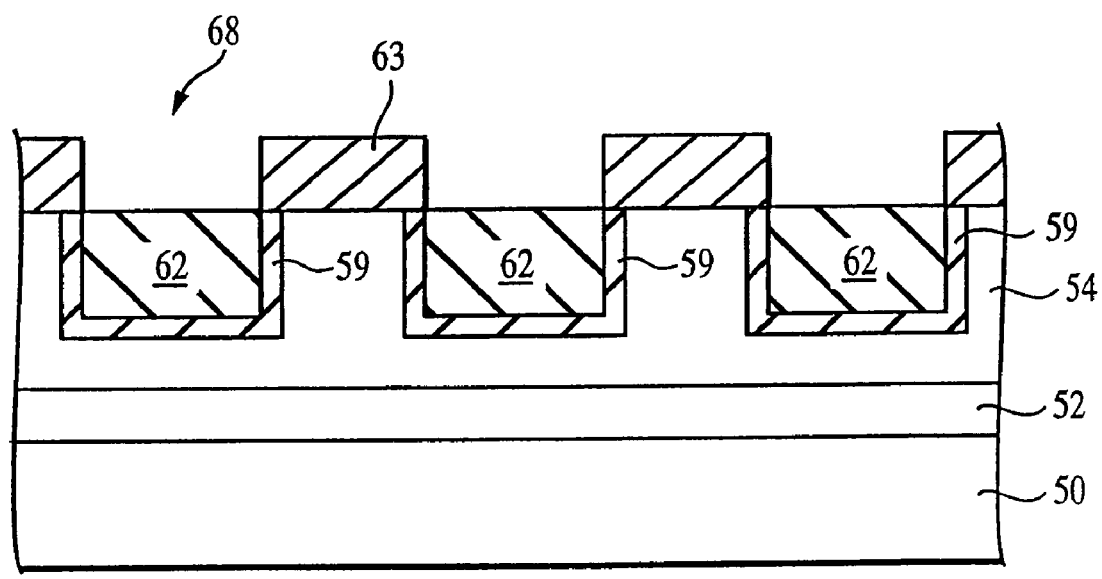
FIG. 12 illustrates a partial cross-sectional view of the MRAM structure at a stage of processing subsequent to that shown in FIG. 11.

Referring still to FIG. 12, in an exemplary embodiment of the present invention, the processing steps for the completion of the MRAM cells 100 are now carried out. As such, a dielectric layer 63 is deposited over the first conductor 62 and barrier layer 59. The dielectric layer 63 is deposited to a thickness at least greater than the thickness of an MRAM cell which is to be formed. The dielectric layer 63 is then patterned and etched to form the cell shaped openings 68 over the first conductor 62. In an exemplary embodiment of the invention, the opening is a trench. However, the openings may also be formed as separate isolated areas within dielectric layer 63 where memory cells are to be fabricated. In this case, each opening is entirely surrounded by dielectric layer 63.

Figure 13:
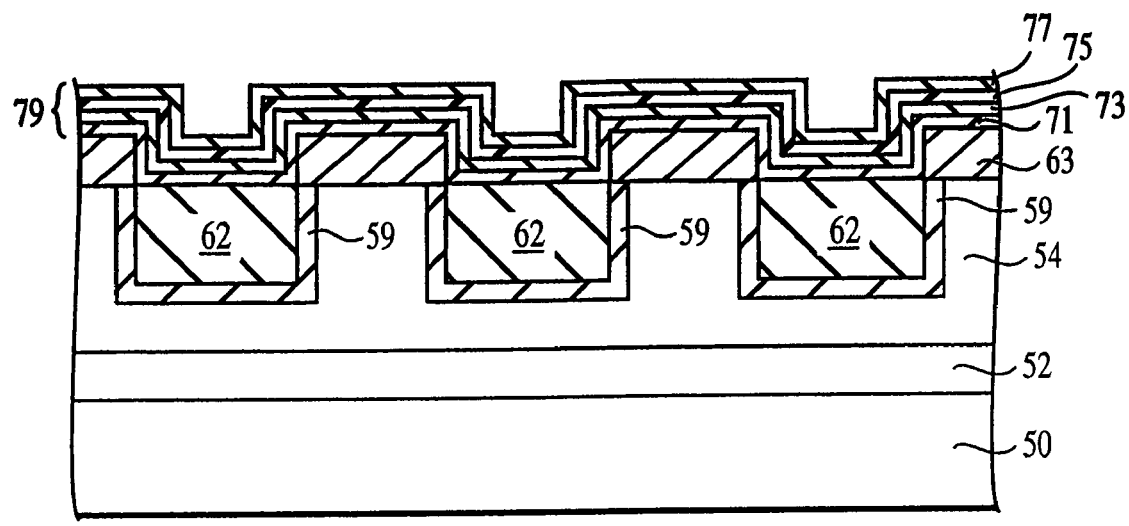
FIG. 13 illustrates a partial cross-sectional view of the MRAM structure at a stage of processing subsequent to that shown in FIG. 12.
Figure 20:
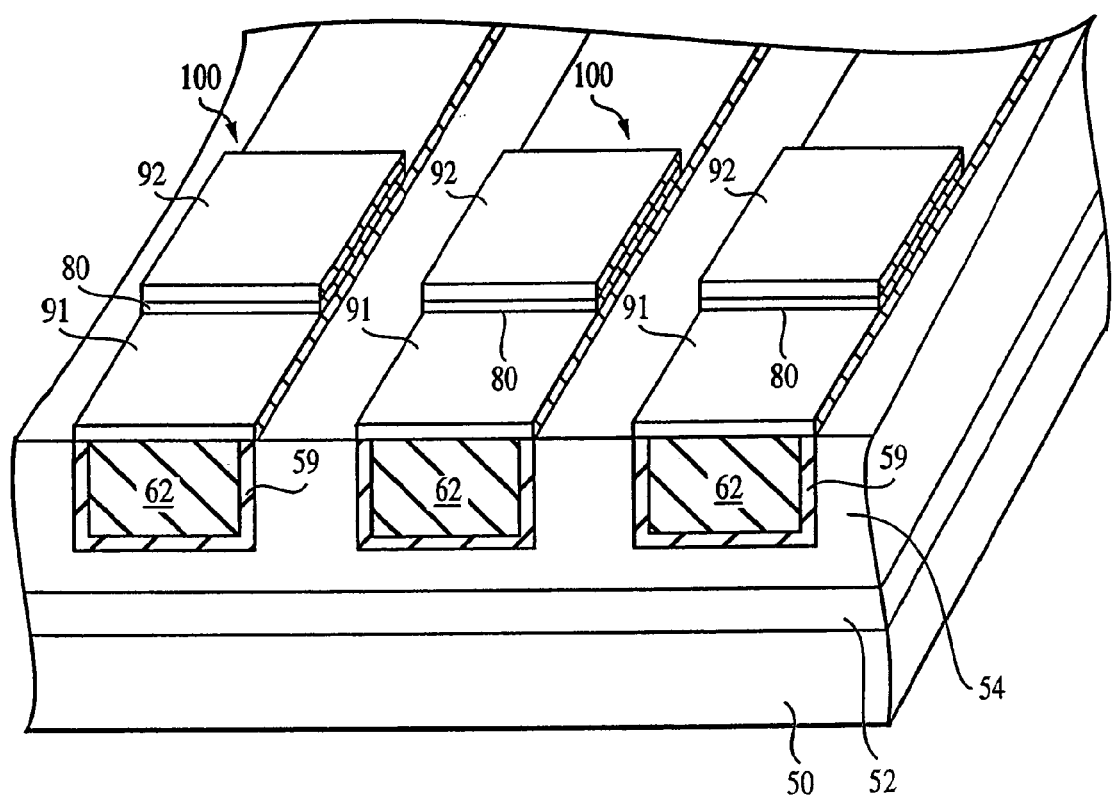
FIG. 20 is a partial three-dimensional view of the MRAM structure at a stage of processing subsequent to that shown in FIG. 19.

Next, as shown in FIG. 13, a plurality of magnetic multilayer films constituting a first magnetic member 79 are first formed over the metal lines 62, barrier layer 59 and dielectric layer 63, which will be later patterned into pinned layers 91 (FIG. 20). The first magnetic member 79 is formed of various material layers, described below in more detail, which are successively deposited over the metal lines 62 and dielectric layer 63, as illustrated in FIG. 13.

In an exemplary embodiment of the present invention and as illustrated in FIG. 13, a first tantalum (Ta) layer 71 (of about 20-400 Angstroms thick, more preferably of about 50 Angstroms thick), a first nickel-iron (NiFe) layer 73 (of about 10-100 Angstroms thick, more preferably of about 60 Angstroms thick), a manganese-iron (MnFe) layer 75 (of about 10-100 Angstroms thick, more preferably of about 100 Angstroms thick) and a second nickel-iron (NiFe) layer 77 (of about 10-100 Angstroms thick, more preferably of about 60 Angstroms thick) are successively blanket deposited over the insulating layer 54 and the metal lines 62, to form the first magnetic member 79. Deposition of the layers 71, 73, 75 and 77 may be accomplished by magnetron sputtering, for example. However, other conventional deposition methods may be used also, as desired. The first magnetic member has a pinned magnetic field which does not switch in response to applied magnetic fields.

Figure 14:
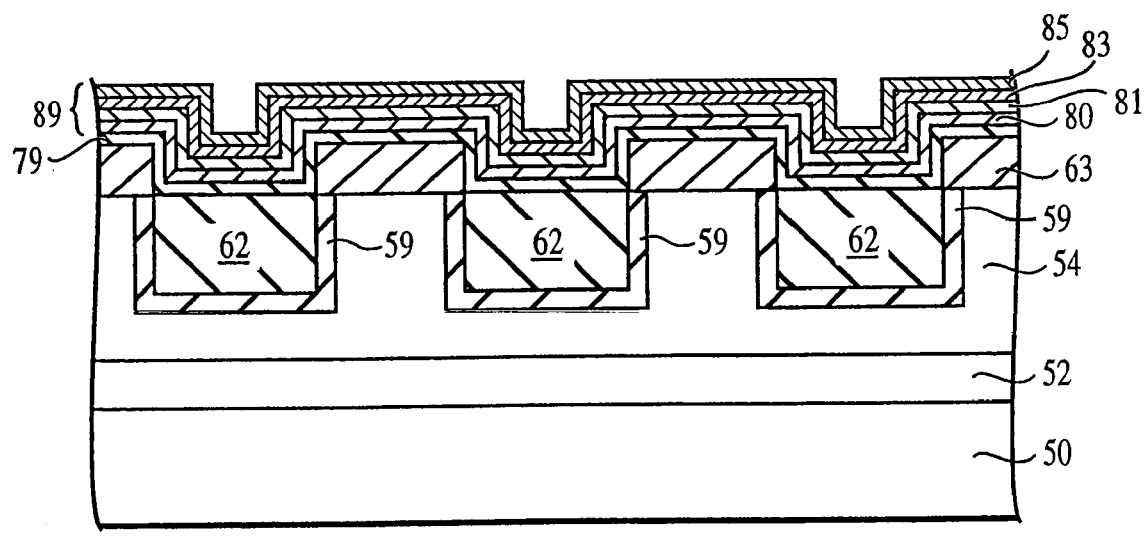
FIG. 14 illustrates a partial cross-sectional view of the MRAM structure at a stage of processing subsequent to that shown in FIG. 13.

Following the deposition of the layers 71, 73, 75 and 77, a nonmagnetic, electrically nonconductive layer or tunnel barrier layer 80 formed of, for example, aluminum oxide ($Al_2O_3$) (of about 5-25 Angstroms thick, more preferably of about 15 Angstroms thick) is next formed overlying the first magnetic member 79, as shown in FIG. 14. Although aluminum oxide is the preferred material, it must be understood that the invention is not limited to its use, and other non-magnetic materials, such as copper (Cu), titanium oxide ($TiO_2$), magnesium oxide (MgO), silicon oxide ($SiO_2$) or aluminum nitride (AlN), may be used also.

Still referring to FIG. 14, a plurality of magnetic multilayer films forming a second magnetic member 89 are next formed over the nonmagnetic layer 80. Accordingly, in an exemplary embodiment of the present invention, a third nickel-iron (NiFe) layer 81 (of about 10-100 Angstroms thick, more preferably of about 40 Angstroms thick), a second tantalum (Ta) layer 83 (of about 10-100 Angstroms thick, more preferably of about 50 Angstroms thick) and a conductive layer 85 (of about 100-400 Angstroms thick, more preferably of about 200-300 Angstroms thick) are successively blanket deposited over the nonmagnetic layer 80, to form the second magnetic member 89, as shown in FIG. 14. Deposition of the layers 81, 83 and 85 may be accomplished by magnetron sputtering, for example, but other conventional deposition methods may be used also, depending on the characteristics of the IC devices constructed previously to the formation of the MRAM cells 100 (FIG. 20). The second magnetic member is a free (sense cell) magnetic member in that its magnetization is free to switch in response to applied magnetic fields.

In an exemplary embodiment of the present invention, the conductive layer 85 may be formed of tungsten nitrogen (WN), which is deposited to a thickness of about 100-400 Angstroms, more preferably of about 200-300 Angstroms. However, the invention is not limited to this exemplary embodiment, this layer may be comprised of a resistive material such as WN, TaN, WSiN, and others. This layer may act as a series resistor and or a CMP stopping layer dependent on the material and thickness chosen. Materials such as a-c amorphous carbon, various oxides and nitrides may be used as CMP stops as well as series resistors.

Figure 15:
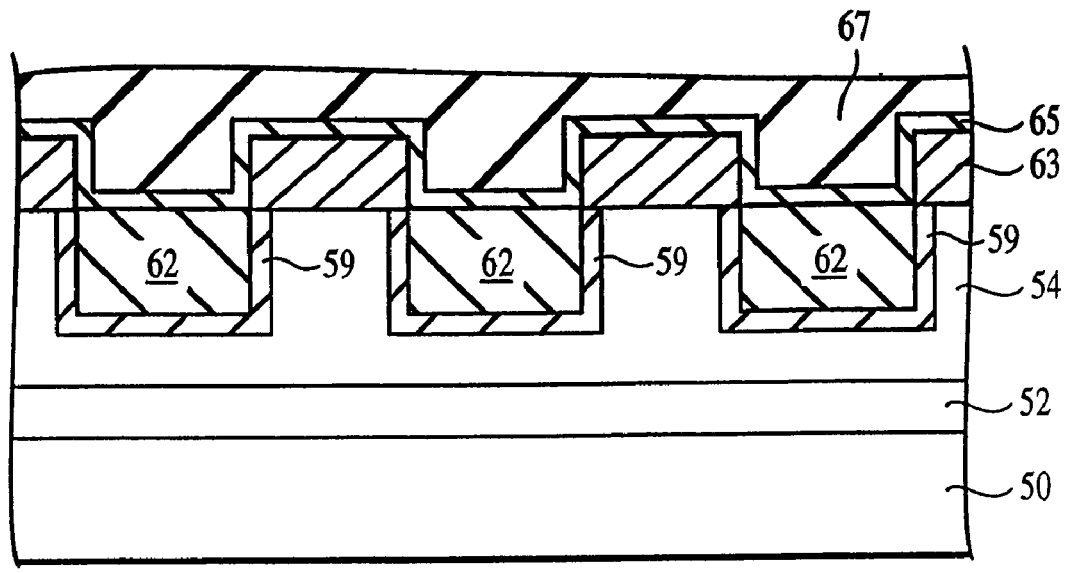
FIG. 15 illustrates a partial cross-sectional view of the MRAM structure at a stage of processing subsequent to that shown in FIG. 14.
Figure 16:
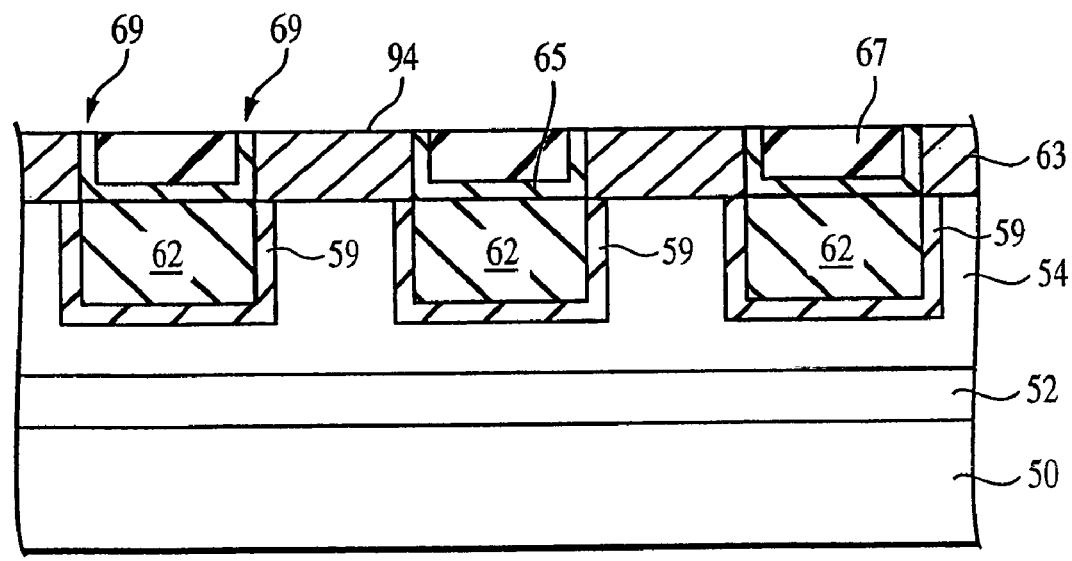
FIG. 16 illustrates a partial cross-sectional view of the MRAM structure at a stage of processing subsequent to that shown in FIG. 15.
Figure 17:
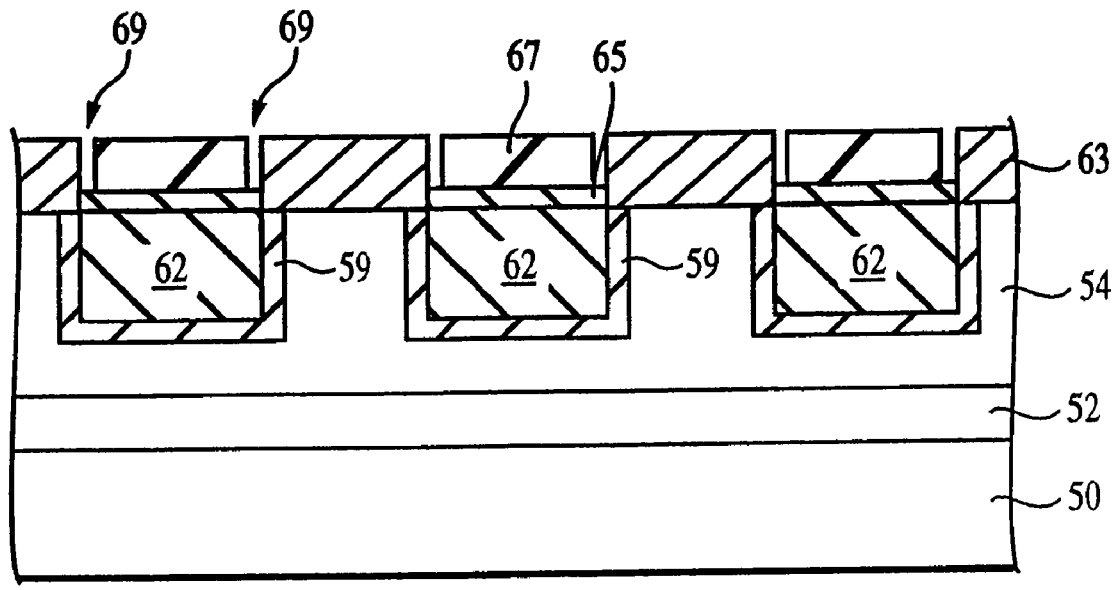
FIG. 17 is a partial three-dimensional view of the MRAM structure at a stage of processing subsequent to that shown in FIG. 16.
Figure 18:
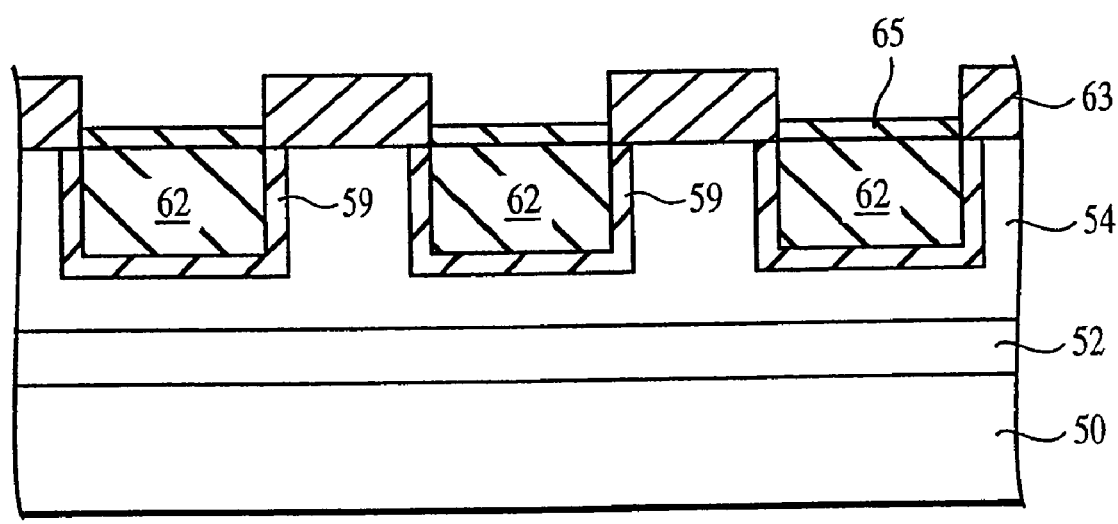
FIG. 18 is a partial three-dimensional view of the MRAM structure at a stage of processing subsequent to that shown in FIG. 17.
Figure 19:
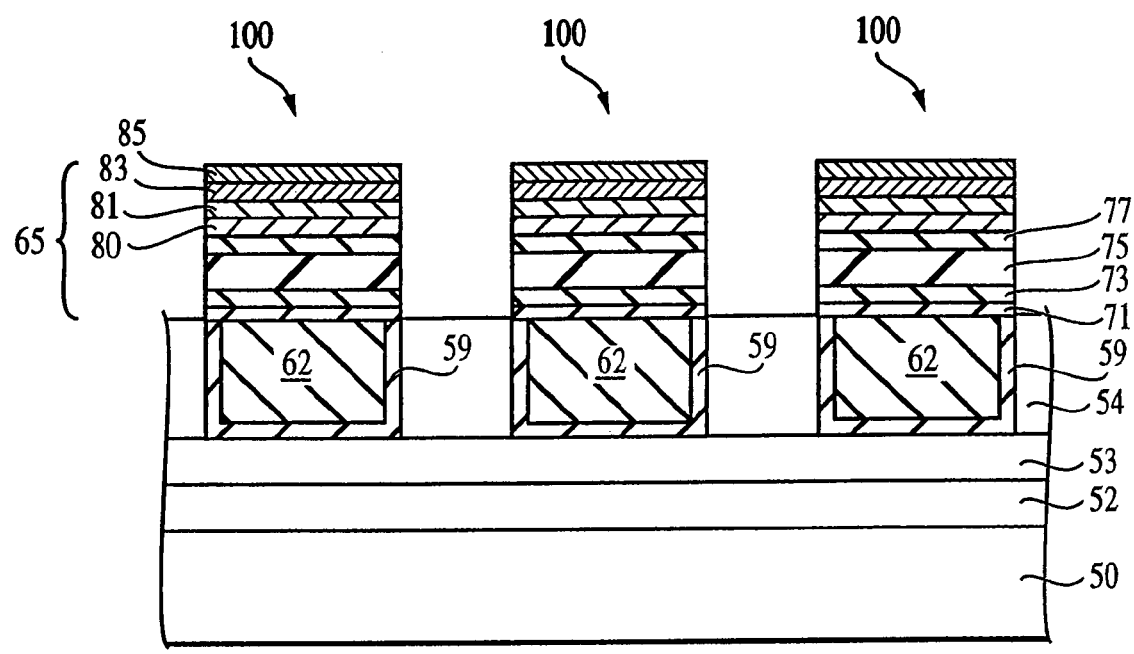
FIG. 19 is a partial three-dimensional view of the MRAM structure at a stage of processing subsequent to that shown in FIG. 18.

The first magnetic member 79, the tunnel barrier layer 80 and the second magnetic member 89 are collectively referred to as magnetic cell layer 65 for ease of explanation. As shown in FIG. 15, a second dielectric layer 67 is formed over the magnetic cell layer 65. Next, portions of layers 71, 73, 75, 77, 80, 81, 83, 85 and 67 (FIGS. 13-16) are removed down to the top plane surface 94 of the first dielectric layer 63 utilizing, for example, CMP, to create a substantially flat, top surface. Hence, CMP is utilized to define the individual MRAM cells rather than processes such as ion milling, as described above. But, while the polishing removes the magnetic layer 65 and the second dielectric layer 67 over the top plane surface 94 of the first dielectric layer 63, it leaves unwanted corners 69. In other words, the resulting structure of the magnetic layer 65, after the planarization step, as described above will have an undesirable "U" like shape, with sidewalls or corners 69 which should be removed to form the desired MRAM cell with a substantially flat topology. The unwanted corners 69, however, can be removed by, for example, low temperature furnace oxidation or wet chemical oxidation to more precisely define the MRAM cells 100.

Next, referring now to FIGS. 17-20, the first and second dielectric layers 63, 67 are patterned and etched, leaving a plurality of MRAM structures or cells 100 (with removed corners 69 in FIG. 17), including columns of pinned layers 91 and rows of sense layers 92. In this way, the present invention minimizes the occurrence of shorts by utilizing the sacrificial first dielectric layer 63 during the planarizing process to define the MRAM cell 100.

Each MRAM structure includes the pinned layer (as part of the first magnetic member 79) separated from a sense layer (as part of the second magnetic member 89) by the nonmagnetic layer 80. For simplicity, the multilayer stack forming the pinned layer 91 is illustrated in FIG. 20 as a single layer. Similarly, the multilayer stack forming the sense layer 92 is also illustrated in FIG. 20 as a single layer. It must be understood, however, that the pinned layer 91 includes patterned portions of layers 71, 73, 75 and 77, while the sense layer 92 includes portions of the layers 81, 83 and 85.

Hence, the present invention provides a first conductor 62 in a trench in an insulating layer 54, with an upper surface of the insulating layer 54 and the first conductor 62 being planarized. Then, a first dielectric layer 63 is deposited over the first conductor 62 and insulating layer 54 to a thickness at least greater than the thickness of the MRAM cell 100 to be formed. The first dielectric layer 63 is then patterned and etched to form openings 68 for the cell shapes over the first conductor 62. Then, the magnetic layers 65 comprising the MRAM cell 100 are consecutively formed over the cell shapes and the first dielectric layer 63. Then, a second dielectric layer 67 is formed over the magnetic layers 65. The second dielectric layer 67 and the magnetic layers 65 are then removed down to the top surface plane of the first dielectric layer 63 to form the MRAM cells 100. Any unwanted corners 69 are removed, for example, by oxidization. Individual MRAM cells 100 are thus formed by a technique which minimizes the occurrence of electrical shorts during fabrication.

Figure 21:
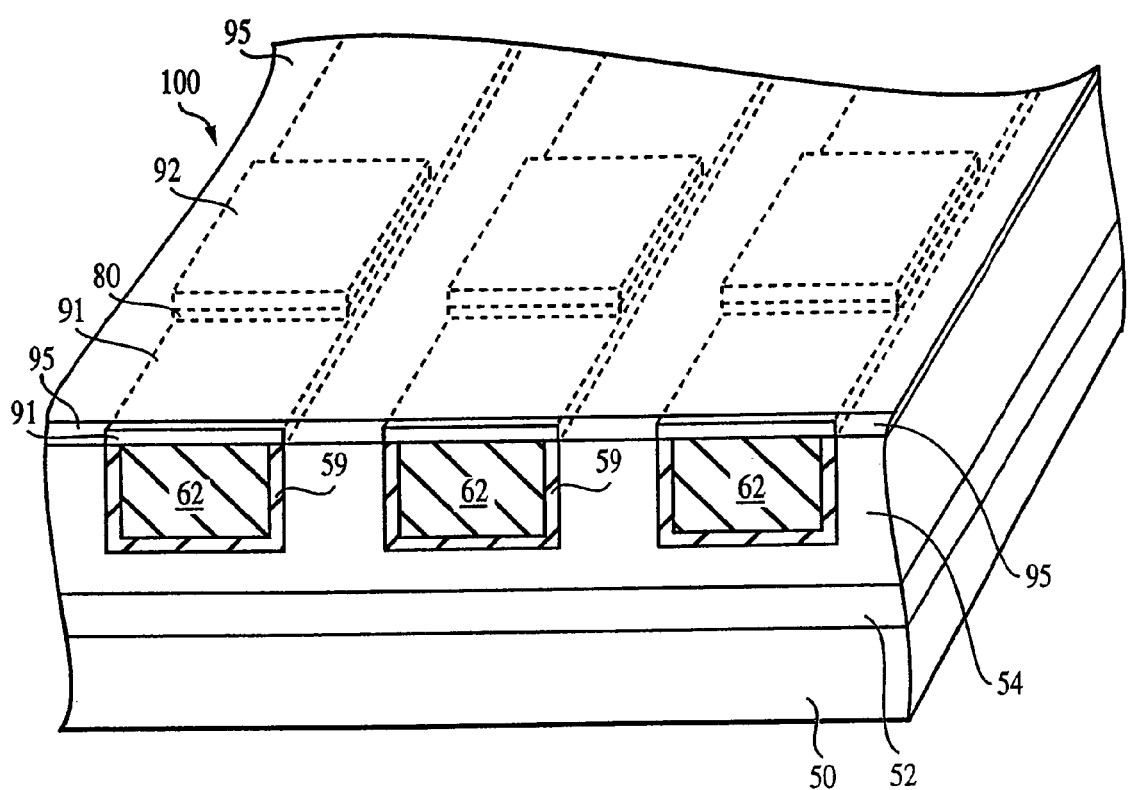
FIG. 21 is a partial three-dimensional view of the MRAM structure at a stage of processing subsequent to that shown in FIG. 20.

After the memory cells 100 are formed (FIG. 20), an insulating layer 95 (FIG. 21) is formed overlying the MRAM cells 100 to a thickness of about 90-10,000 Angstroms, more preferably of about 5,000 Angstroms. The insulating layer 95 completely fills the spaces between any adjacent MRAM cells 100, as shown in FIG. 21. In an exemplary embodiment of the invention, the insulating layer 95 is formed of a nitride material such as silicon nitride ($Si_3N_4$), which may be formed by conventional deposition methods, such as sputtering by chemical vapor deposition (CVD), plasma enhanced CVD (PECVD), or physical vapor deposition (PVD), among others. However, other conventional insulating materials, for example, BPSG, aluminum oxide, a thermal oxide of silicon, such as SiO or $SiO_2$, or a high temperature polymer, such as a polyimide, a low dielectric constant inorganic material, amorphous dielectric, or bias sputtered quartz may also be employed.

Figure 22:
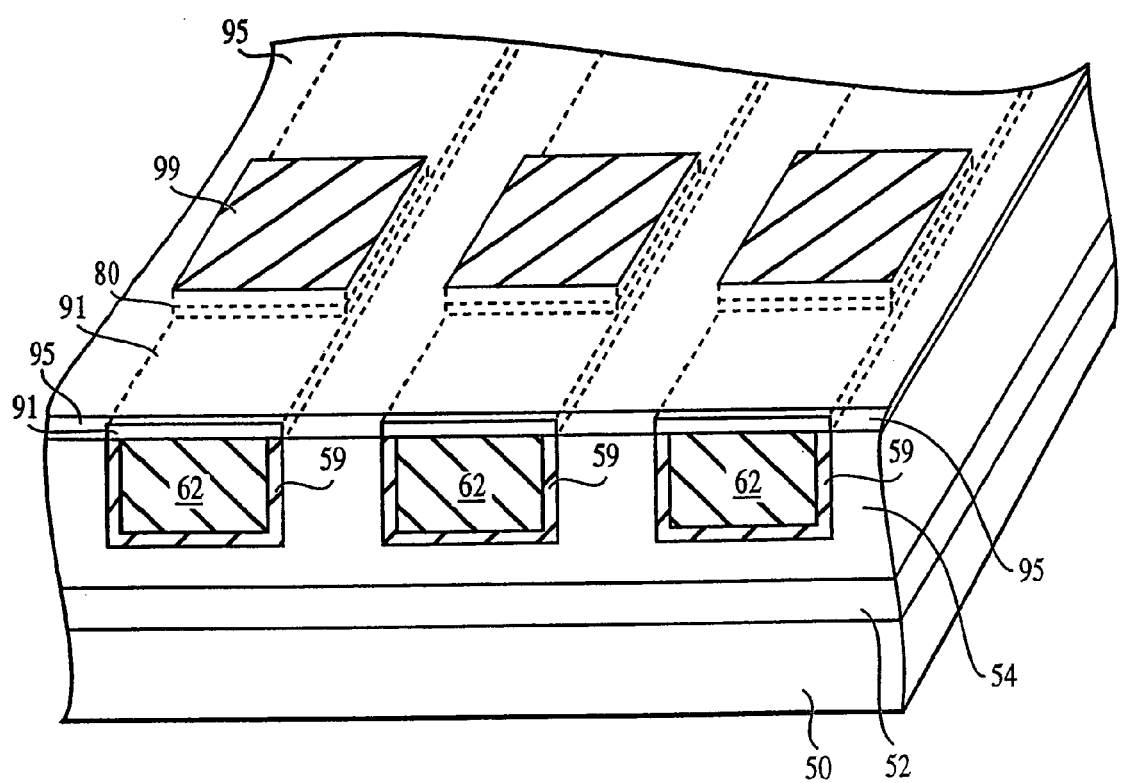
FIG. 22 is a partial three-dimensional view of the MRAM structure at a stage of processing subsequent to that shown in FIG. 21.

Subsequent to the formation of the insulating layer 95, portions of the insulating layer 95 that are formed over the top surface of the MRAM cells 100 are removed by means of CMP or well-known RIE dry etching processes (FIG. 22). In an exemplary embodiment of the invention, the insulating layer 95 is chemical mechanical polished to remove the top surface of the insulating layer 95 above the MRAM cells 100, down to or near the planar surface of the top surface of the conductive layer 85, to form respective MRAM contacts 99. This way, the conductive layer 85, which was formed as part of the sense layer 92 of the MRAM cell 100, acts as a polishing stop layer in the formation of the contacts 99.

Figure 23:
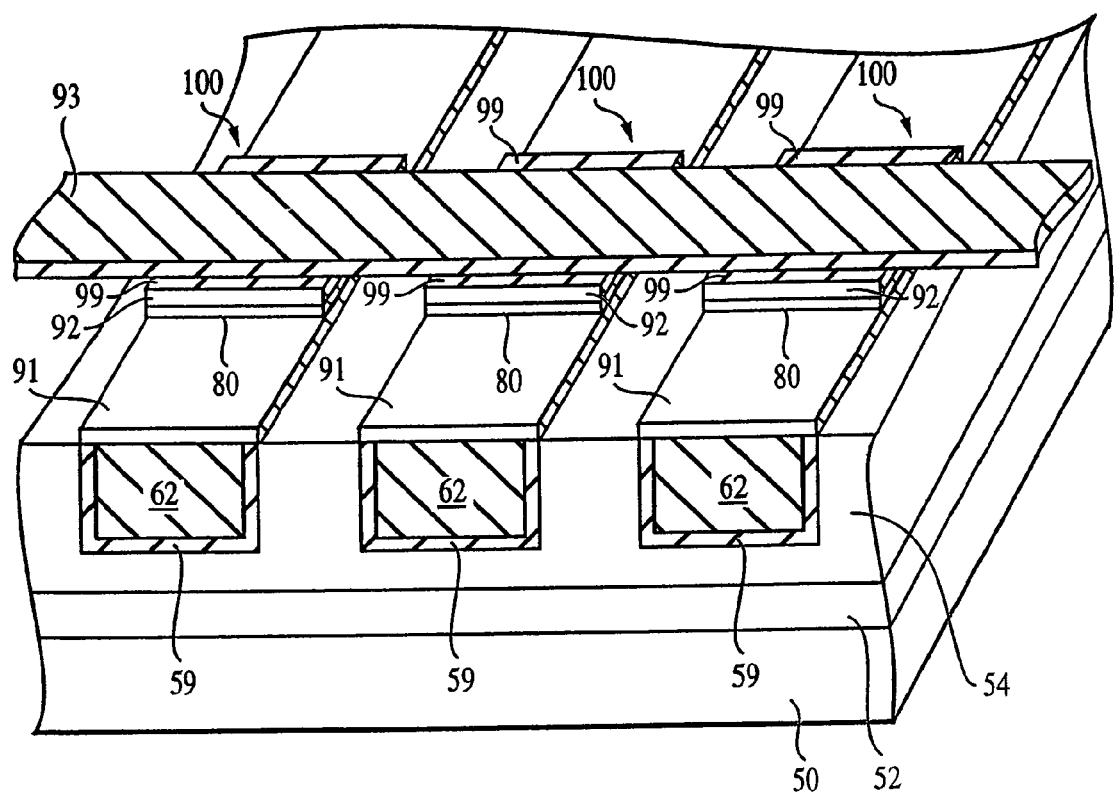
FIG. 23 is a partial three-dimensional view of the MRAM structure at a stage of processing subsequent to that shown in FIG. 22.

Additional steps to create a functional MRAM cell having a contact may be carried out. For example, FIG. 23 illustrates schematically three MRAM cell structures 100 coupled to a word line 93 that intersects three pinned layers 91 and associated sense layers 92 at respective MRAM contacts 99. As known in the art, the word line 93 may be formed of copper, for example, by patterning a mask on a dielectric layer, which is formed over the sense layers 92 including the MRAM contacts 99, and by forming a trench in which conductive word line 93 is formed in a direction orthogonal to that of the sense layer 92. For a better understanding of the invention, the polished insulating layer 96 has been omitted in FIG. 23 to illustrate the pinned layers and sense layers 91, 92 below the word line 93. However, it must be understood that the space between the pinned layers and sense layers 91, 92 and below the word line 93 is filled with the insulating layer 96.

Although FIG. 23 illustrates MRAM contacts 99 in direct contact and adjacent to the word line 93, it must be understood that the invention is not limited to this embodiment, and other interceding structures, such as conductive plugs and/or metal lines from the MRAM contacts 99 to the word line 93 may be formed also, as desired.

Figure 24:
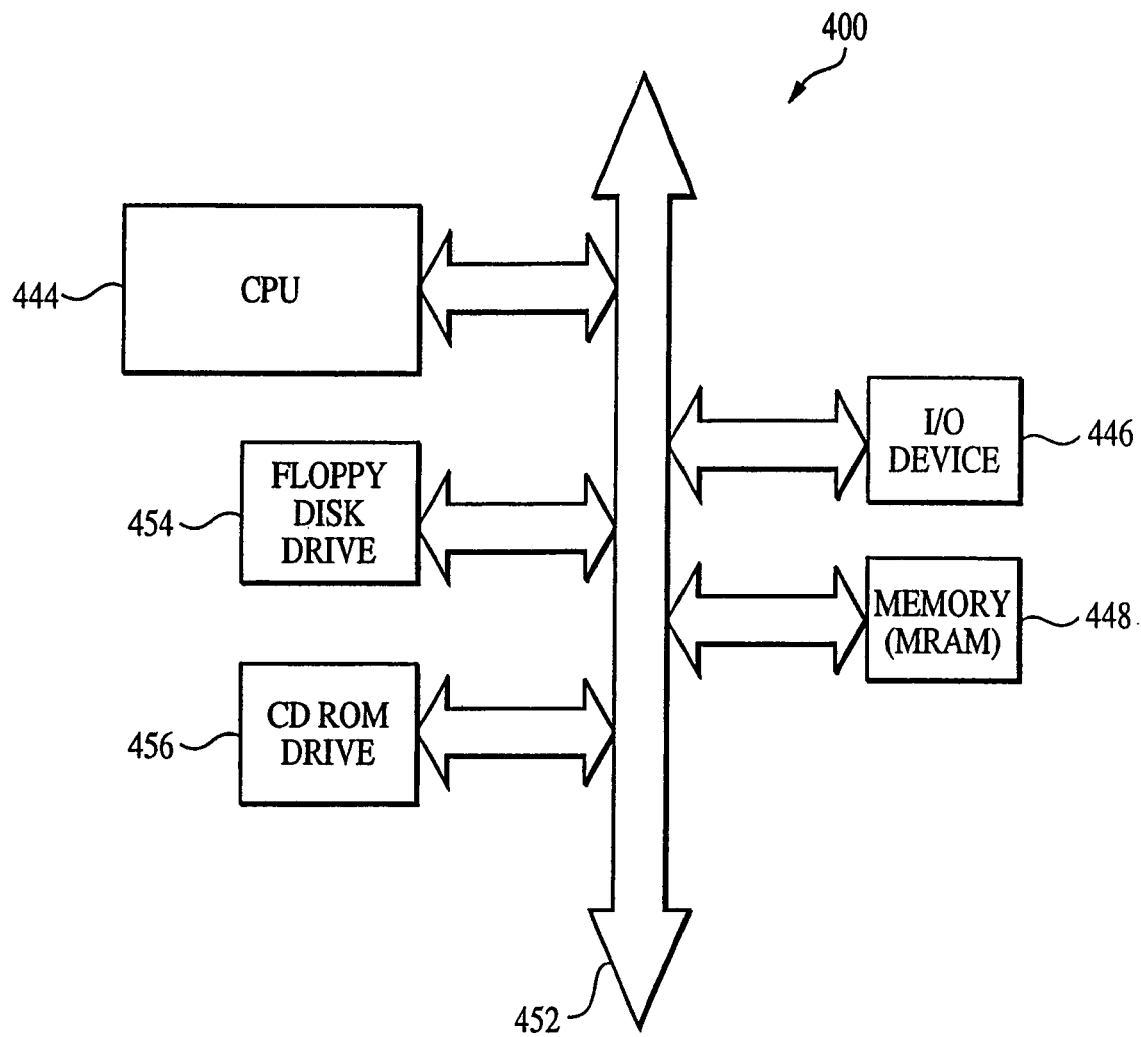
FIG. 24 is a schematic diagram of a processor system incorporating an MRAM constructed in accordance with the present invention.

A typical processor system 400 which includes a memory circuit 448, for example an MRAM with MRAM cell structures 100 constructed according to the present invention is illustrated in FIG. 24. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452, typically through a memory controller.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiments described above illustrate the formation of three MRAM cell structures 100 it is to be understood that the present invention contemplates the use of a plurality of MRAM cells arranged, for example, in rows and columns in a memory cell array. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as nickel-iron (permalloy) or iron, among others, may be used also. Further, although the exemplary embodiments described above refer to defining the MRAM structures by chemical mechanical polishing, it must be understood that the present invention contemplates the use of other methods of pattern definition.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A magnetic random access memory cell, said memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
      a second plurality of films including a ferromagnetic material adjacent said nonmagnetic tunnel barrier layer and a tantalum film adjacent said ferromagnetic material, and;
      an oxide layer adjacent to said second magnetic layer.

2. The memory cell of claim 1, wherein said nonmagnetic tunnel barrier layer comprises aluminum oxide.

3. The memory cell of claim 2, wherein said aluminum oxide has a thickness of about 5 to 25 Angstroms.

4. The memory cell of claim 1, wherein said nonmagnetic tunnel barrier layer comprises a material selected from the group consisting of copper, titanium oxide, magnesium oxide, silicon oxide and aluminum nitride.

5. The memory cell of claim 1, wherein said first magnetic layer comprises a first tantalum layer, a first nickel-iron layer, a manganese-iron layer, and a second nickel-iron layer.

6. A processor system comprising at least one memory circuit, wherein said at least one memory circuit comprises at least one memory cell, said at least one memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
      a second plurality of films including a ferromagnetic material adjacent said nonmagnetic tunnel barrier layer and a tantalum film adjacent said ferromagnetic material, and;
      an oxide layer adjacent to said second magnetic layer.

7. A memory circuit, said memory circuit comprising:
   a plurality of memory cells, each memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
   a second plurality of films including a ferromagnetic material adjacent said nonmagnetic tunnel barrier layer and a tantalum film adjacent said ferromagnetic material, and;
   an oxide layer adjacent to said second magnetic layer.

8. A magnetic random access memory cell, said memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
      a second plurality of films including a ferromagnetic material adjacent said nonmagnetic tunnel barrier layer and a tantalum film adjacent said ferromagnetic material; and
      a nitride layer adjacent to said second magnetic layer.

9. The memory cell of claim 8, wherein said first magnetic layer is a pinned layer.

10. The memory cell of claim 8, wherein said nonmagnetic tunnel barrier layer comprises aluminum oxide.

11. The memory cell of claim 9, wherein said aluminum oxide has a thickness of about 5 to 25 Angstroms.

12. The memory cell of claim 8, wherein said nonmagnetic tunnel barrier layer comprises a material selected from the group consisting of copper, titanium oxide, magnesium oxide, silicon oxide and aluminum nitride.

13. The memory cell of claim 8, wherein said first magnetic layer comprises a first tantalum layer, a first nickel-iron layer, a manganese-iron layer, and a second nickel-iron layer.

14. The memory cell of claim 12, wherein said plurality of films comprises a third nickel-iron layer, a second tantalum layer, and a tungsten nitrogen chemical mechanical polishing stop.

15. A processor system comprising at least one memory circuit, wherein said at least one memory circuit comprises at least one memory cell, said at least one memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
      a second plurality of films including a ferromagnetic material adjacent said nonmagnetic tunnel barrier layer and a tantalum film adjacent said ferromagnetic material; and
      a nitride layer adjacent to said second magnetic layer.

16. A memory circuit, said memory circuit comprising:
   a plurality of memory cells, each memory cell comprising:
   a first magnetic layer adjacent a conductive layer, said first magnetic layer comprising a first plurality of films;
   a nonmagnetic tunnel barrier layer separated from said conductive layer by said first magnetic layer; and
   a second magnetic layer separated from said first magnetic layer by said nonmagnetic tunnel barrier layer, said second magnetic layer comprising:
   a second plurality of films including a ferromagnetic material adjacent said nonmagnetic tunnel barrier layer and a tantalum film adjacent said ferromagnetic material, and;
   a nitride layer adjacent to said second magnetic layer.

* * * * *